United States Patent
Wu et al.

(10) Patent No.: US 8,837,192 B2
(45) Date of Patent: Sep. 16, 2014

(54) N-BIT ROM CELL

(71) Applicant: Taiwan Semiconductor Manufacturing Company Limited, Hsin-Chu (TW)

(72) Inventors: Ching-Wei Wu, Nantou County (TW); Kuang Ting Chen, Taipei (TW); Cheng Hung Lee, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 29 days.

(21) Appl. No.: 13/655,556

(22) Filed: Oct. 19, 2012

(65) Prior Publication Data

US 2014/0112048 A1    Apr. 24, 2014

(51) Int. Cl.
*G11C 17/00* (2006.01)
*G11C 17/12* (2006.01)
*G11C 7/00* (2006.01)
*G11C 5/02* (2006.01)
*G11C 5/06* (2006.01)
*G11C 11/56* (2006.01)

(52) U.S. Cl.
CPC .............. *G11C 5/02* (2013.01); *G11C 11/5692* (2013.01); *G11C 5/06* (2013.01)
USPC .............................. 365/63; 365/103; 365/104

(58) Field of Classification Search
CPC .......... G11C 11/5692; G11C 5/06; G11C 5/02
USPC .......................................... 365/103, 104, 63
See application file for complete search history.

(56) References Cited

U.S. PATENT DOCUMENTS

| 4,604,730 | A | * | 8/1986 | Yoshida et al. | ........... | 365/185.09 |
| 5,734,612 | A | | 3/1998 | Yoshikawa | | |
| 5,835,432 | A | | 11/1998 | Nakano | | |
| 7,075,828 | B2 | | 7/2006 | Lue et al. | | |
| 7,301,828 | B2 | | 11/2007 | Dudeck et al. | | |
| 7,660,143 | B2 | | 2/2010 | Montfort et al. | | |
| 2008/0170426 | A1 | | 7/2008 | Liaw | | |
| 2008/0192544 | A1 | * | 8/2008 | Berman et al. | ........... | 365/185.09 |

(Continued)

OTHER PUBLICATIONS

"Thread: OD layer what does it mean in TSMC process" Retrieved on Aug. 7, 2012, pp. 1-4, http://www.edaboard.com/thread74079.html.

(Continued)

*Primary Examiner* — Ly D Pham
(74) *Attorney, Agent, or Firm* — Cooper Legal Group, LLC

(57) ABSTRACT

Among other things, an n-bit ROM cell, such as a twin-bit ROM cell, and techniques for addressing one or more ROM cell portions of the n-bit ROM cell are provided. A twin-bit ROM cell comprises a first ROM cell portion adjacent to or substantially contiguous with a second ROM cell portion. The first ROM cell portion is associated with a first data bit value. The second ROM cell portion is associated with a second data bit value distinct from the first data bit value. Because the first ROM cell portion is adjacent to the second ROM cell portion, OD-to-OD spacing between the twin-bit ROM cell and an adjacent twin-bit ROM cell is increased to provide, for example, improved isolation, cell current, ROM speed, and VCCmin performance in comparison with single-bit ROM cells, while maintaining a substantially similar to pitch as the single-bit ROM cells.

20 Claims, 6 Drawing Sheets

(56) References Cited

U.S. PATENT DOCUMENTS

| | | | |
|---|---|---|---|
| 2008/0253162 A1* | 10/2008 | Montfort et al. | 365/104 |
| 2009/0116288 A1* | 5/2009 | Varkony | 365/185.13 |
| 2010/0078725 A1 | 4/2010 | Hou et al. | |
| 2011/0013725 A1* | 1/2011 | Chan | 375/296 |
| 2011/0055783 A1* | 3/2011 | Yang | 716/122 |
| 2011/0069527 A1 | 3/2011 | Liaw | |

OTHER PUBLICATIONS

"SDRAM Technology", Sep. 1, 2009, pp. 1-4, http://www.sdram-technology.info/bitlines-wordlines.html.

* cited by examiner

N-BIT ROM CELL

BACKGROUND

A semiconductor read only memory (ROM) is a type of solid state memory that permanently stores data in that data is generally not lost when power is disconnected from the memory. The semiconductor ROM comprises one or more ROM cell arrays. A ROM cell array comprises one or more ROM cells that are set to either an "on" or "off" state by programming the semiconductor ROM. ROM cells are capable of storing a binary bit of data based upon an accumulation of charge, such as electrons or holes, for example, representing either a logic state of "0" or "1" depending on whether a path of a bit line to ground (VSS) of the ROM cell is electrically connected or isolated. A single-end sensing circuit, such as an inverter, or a differential sensing circuit is used to detect a data state of a ROM cell. For example, a relatively lower voltage state, resulting from little to no accumulation of charge, represents a logic value of "0", while a relatively higher voltage state, resulting from a greater accumulation of charge, represents a logical value of "1" or vice versa.

To achieve an increase in memory density of semiconductor ROMs, the size of ROM cell arrays has decreased. For example, decreasing OD-to-OD spacing between oxide diffusion (OD) regions that define active source/drain regions for transistors of ROM cells allows for additional ROM cells to be formed within the semiconductor ROM to increase memory density. Unfortunately, decreasing OD-to-OD spacing leads to cell current degradation, commonly referred to as OD space effect. Cell current degradation adversely impacts ROM performance characteristics such as speed and VCCmin performance, where VCCmin corresponds to a minimum voltage at which the ROM operates reliably, for example.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

Among other things, an N-bit ROM cell and techniques for addressing one or more ROM cell portions of the N-bit ROM cell are provided. A ROM cell array comprises one or more N-bit ROM cells. In some embodiments, an N-bit ROM cell comprises a twin-bit ROM cell associated with two distinct data bit values, but may also comprise a tri-bit ROM cell associated with three distinct data bit values, a quad-bit ROM cell associated with four distinct data bit values, etc. That is, a twin-bit ROM cell is generally used herein for illustration, but the application is not limited to a twin-bit ROM cell. By way of example, and not limitation, a twin-bit ROM cell comprises a first ROM cell portion having a first pair of bit lines associated with a first data bit value, such as first bit line 216 and second bit line 218 of first ROM cell portion 204, for example. The twin-bit ROM cell also comprises a second ROM cell portion having a second pair of bit lines associated with a second data bit value, such as third bit line 220 and fourth bit line 222 of second ROM cell portion 206, for example.

The first ROM cell portion 204 and the second ROM cell portion 206 of the twin-bit ROM cell 238 are formed adjacent to one another. For example, the first ROM cell portion 204 is contiguous with the second ROM cell portion 206, such that a first OD region 242 of the first ROM cell portion 204 is adjacent to a second OD region 244 of the second ROM cell portion 206 with little to no OD-to-OD spacing there-between, for example. In this way, a pitch 126 of the twin-bit ROM cell is substantially similar to a pitch between two single-bit ROM cells because of the lack of spacing between the first ROM cell portion 204 and the second ROM cell portion 206. Moreover, given the lack of spacing between the first ROM cell portion 204 and the second ROM cell portion 206, OD-to-OD spacing 234 between the twin-bit ROM cell 238 and an adjacent twin-bit ROM cell 240 is increased in comparison with OD-to-OD spacing between two single-bit ROM cells to provide improved, isolation, cell current and ROM speed, for example.

The twin-bit ROM cell is configured according to a first coding scheme and a second coding scheme, such that either the first data bit value associated with the first bit line 216 and the second bit line 218 of the first ROM cell portion 204 or the second data bit value associated with the third bit line 220 and the fourth bit line 222 of the second ROM cell portion 206 can be identified. For example, the first coding scheme is used to identify which word lines of the ROM cell array are associated with which bit lines of the twin-bit ROM cell, and the second coding scheme is used to identify whether a data bit value is to be sensed from the first ROM cell portion or from the second ROM cell portion. In an example of the first coding scheme, a first ROM code is mapped to a first bit line, a second ROM code is mapped to a second bit line, a third ROM code is mapped to a third bit line, and a fourth ROM code is mapped to a fourth bit line. In addition to being mapped with one or more bit lines, ROM codes are also assigned to one or more word lines of the ROM cell array. For example, the first ROM code is assigned to a first word line, the second ROM code is assigned to a second word line, the third ROM code is assigned to a third word line, and the fourth ROM code assigned to a fourth word line. It is to be appreciated, however, that the foregoing is merely an example and that various assignments can be used, such as an assignment of the first ROM code with the second word line, the second ROM code with the fourth word line, the third ROM code with the first word line, and the fourth ROM code with the third word line, for example.

In this way, the first bit line is associated with the first word line based upon the first ROM code. For example, the first bit line 216 is connected by a via 224 to a drain of a transistor 314, such that turning on the first word line 208 applies a bias to or activates a gate of the transistor 314 to pull the first bit line 216 from a pre-charged state, such as a voltage representing a logical "1", to ground through a source of the transistor 314, representing a logical "0". The second bit line is associated with the second word line based upon the second ROM code. For example, the second bit line 218 is connected by a via 226 to a drain of a transistor 316, such that turning on the second word line 210 applies a bias to or activates a gate of the transistor 316 to pull the second bit line 218 from a pre-charged state to ground through a source of the transistor 316. In this way, the first bit line 216 and the second bit line 218 are used to represent or access the first data bit value of the first ROM cell portion. The third bit line is associated with the third word line based upon the third ROM code. For example, the third bit line 220 is connected by a via 228 to a drain of a transistor 318, such that turning on the third word line 212 applies a bias to or activates a gate of the transistor 318 to pull the third bit line 220 from a pre-charged state to ground through a source of the transistor 318. The fourth bit line is associated with the fourth word line based upon the fourth ROM code. For example, the fourth bit line 222 is connected by a via 230 to a drain of a transistor 320, such that turning on the fourth word line 214 applies a bias to or activates a gate of the transistor 320 to pull the fourth bit line 22 from a pre-charged state to ground through a source of the transistor 320.

In an example of the second coding scheme, a first connection is created between the first bit line 216 and a first data line 406, and a second connection is created between the first bit line 216 and a second data line 408. A third connection is created between the second bit line 218 and the second data line 408, and a fourth connection is created between the second bit line 218 and the first data line 406. A fifth connection is created between the third bit line 220 and the first data line 406, and a sixth connection is created between the third bit line 220 and the first data line 406. A seventh connection is created between the fourth bit line 222 and the second data line 408, and an eighth connection is created between the fourth bit line 222 and the second data line 408. It is appreciated that various combinations of bit line to data line connections can be created, and that the foregoing is merely a non-limiting example.

A ROM data reader, such as a single-end sensing amplifier or a differential sensing amplifier, is configured to identify the first data bit value for the first ROM cell portion based upon at least one output value detected from the first data line, at least one output value detected from the second data line, or at least one output value detected from the first data line and at least one output value detected from the second data line. An output value, for example, corresponds to a voltage or current that is detected as either a relatively low voltage or current representing a logical "0" or a relatively high voltage or current representing a logical "1", for example. The ROM data reader is configured to identify the second data bit value for the second ROM cell portion in a similar fashion, such as based upon at least one output value of the first data line, at least one output value of the second data line, or at least one output value of the first data line and at least one output value of the second data line. In some embodiments, a differential sensing amplifier is configured to sense a difference between the first bit line 216 and the second bit line 218 to identify the first data bit value. For example, the first bit line 216 is pulled from a pre-charged state to ground by turning on the first word line 208 to activate the transistor 314, while the second bit line 218 remains at a pre-charge state to produce a "0" on the first bit line 216 and a "1" on the second bit line 218, which is sensed by the differential sensing amplifier to identify the first data bit value. In another example, the differential sensing amplifier is configured to sense a difference between the third bit line 220 and the fourth bit line 222 to identify the second data bit value. For example, the third bit line 220 is pulled from a pre-charged state to ground by turning on the third word line 212 to activate the transistor 318 and the fourth bit line 222 is pulled from a pre-charged state to ground by turning on the fourth word line 214 to active the transistor 320 to produce a "0" on the third bit line 220 and a "0" on the fourth bit line 222, which is sensed by the differential sensing amplifier to identify the second data bit value. In this way, the twin-bit ROM cell comprises the first ROM cell portion and the second ROM cell portion that are addressed according to the first coding scheme and the second coding scheme, such that output from the twin-bit ROM cell can be identified as either the first data bit value for the first ROM cell portion or the second data bit value for the second ROM cell portion.

The following description and annexed drawings set forth certain illustrative aspects and implementations. These are indicative of but a few of the various ways in which one or more aspects may be employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
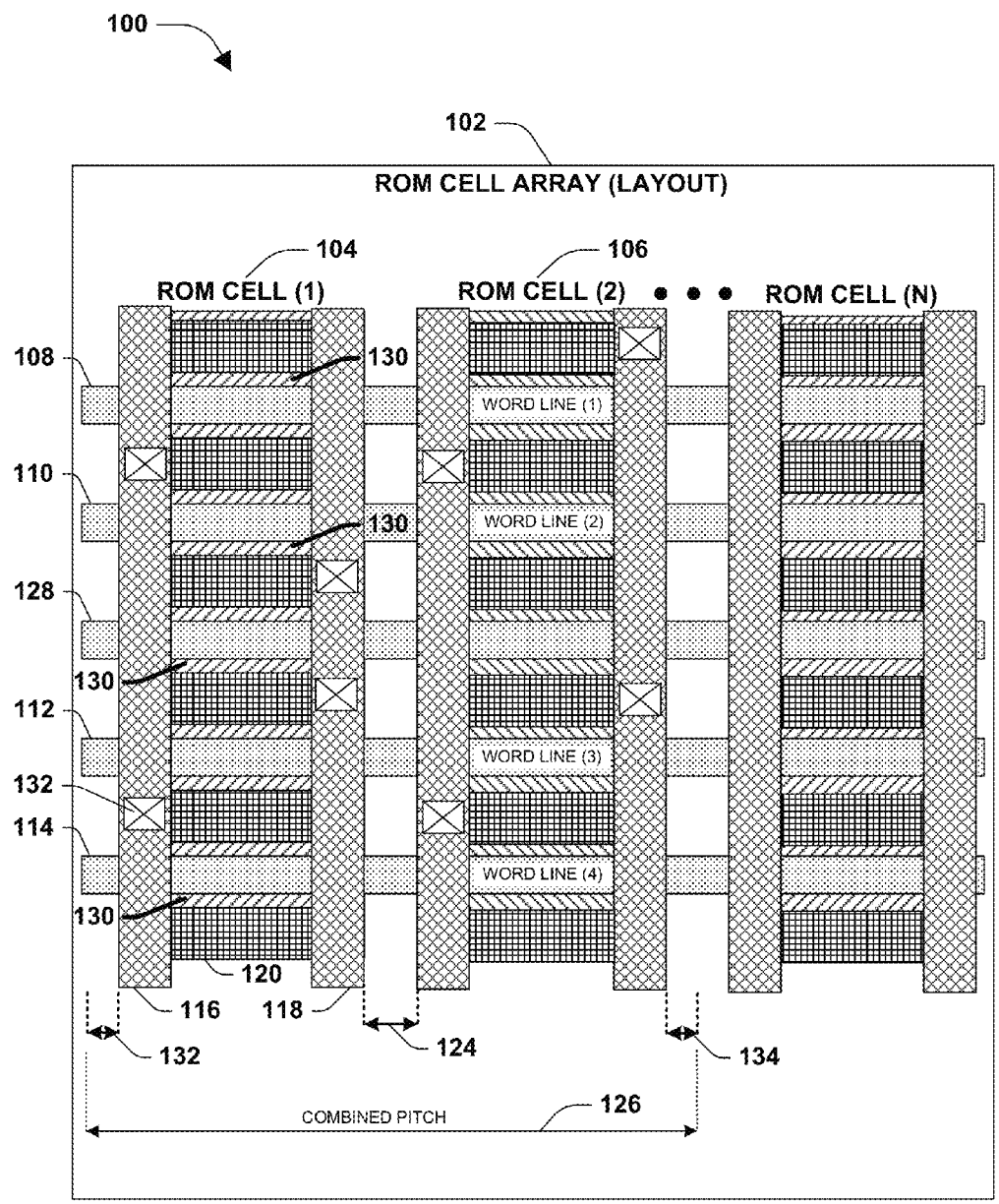
FIG. 1 is an illustration of an example of a design layout for a ROM cell array, in accordance with an embodiment.

The disclosed subject matter is now described with reference to the drawings, wherein like reference numerals are generally used to refer to like elements throughout. In the following description, for purposes of explanation, numerous specific details are set forth in order to provide an understanding of the disclosed subject matter. It may be evident, however, that the disclosed subject matter may be practiced without these specific details. In other instances, structures and devices are illustrated in block diagram form in order to facilitate describing the disclosed subject matter.

FIG. 1 illustrates an example 100, in accordance with an embodiment, of a design layout for a ROM cell array 102 configured according to a single-bit cell layout. It is to be appreciated that the ROM cell array 102 can comprise an N-bit cell layout, such as a twin-bit cell layout that comprises two bit cells, a tri-bit cell layout that comprises three bit cells, a quad-bit cell layout that comprises four bit cells, etc. The ROM cell array 102 comprises a first ROM cell 104, a second ROM cell 106, and other ROM cells that are configured according to the single-bit cell layout. The first ROM cell 104 comprises a continuous OD region 130 that runs through one or more transistors of the first ROM cell 104. The continuous OD region 130 defines one or more active regions, such as source regions or drain regions, for example, for the one or more transistors. A first gate 108, a second gate 110, a third gate 112, and a fourth 114 are used as gates for the one or more transistors. A dummy gate 128, connected to a reference voltage VSS line or ground, of an isolation transistor is disposed between the second gate 110 and the third gate 112. The gates generally comprise a poly, metal, or other conductive gate material. The first gate 108 corresponds to a first word line, the second gate 110 corresponds to a second word line, the third gate 112 corresponds to a third word line, and the fourth gate 114 corresponds to a fourth word line of the ROM cell array 102.

The first ROM cell 104 comprises a first bit line 116 and a second bit line 118. In an embodiment, the bit lines are disposed in metal (1) layer, and are connected to one or more metal (2) layers, such as metal (2) layer 120, generally through a conductive via, such as via 132. The one or more metal (2) layers are connected to either a source region or a drain region of the continuous OD region 130. In this way, the first bit line 116, for example, connects to metal (2) layer 120 through vial 132 to connect to a source region or a drain of the continuous OD region 130, as the metal (2) layer 120 is connected to the continuous OD region 130.

To achieve an increase in memory density within the ROM cell array 102, OD-to-OD spacing between ROM cells is decreased so that additional ROM cells fit within the ROM cell array 102. For example, OD-to-OD spacing 124 between the first ROM cell 104 and the second ROM cell 106 comprises a spacing of about 80 nm. If the first ROM cell 104 has a width of about 180 nm and the second ROM cell 106 has a width of about 180 nm, then the first and second ROM cells have a combined pitch 126 of about 520 nm that corresponds to a first OD spacing 132 of 40 nm for the first ROM cell 104, the 180 nm width of the first ROM cell 104, the OD-to-OD spacing 124 of 80 nm between the first ROM cell 104 and the second ROM cell 106, the 180 nm width of the second ROM cell 106, and a second OD spacing 134 of 40 nm for the second ROM cell 106. However, because the OD-to-OD spacing 124, used to achieve the combined pitch 126 of 520 nm, is relatively small at 80 nm, cell current is impacted, which affects isolation, ROM speed and VCCmin performance, for example.

Figure 2:
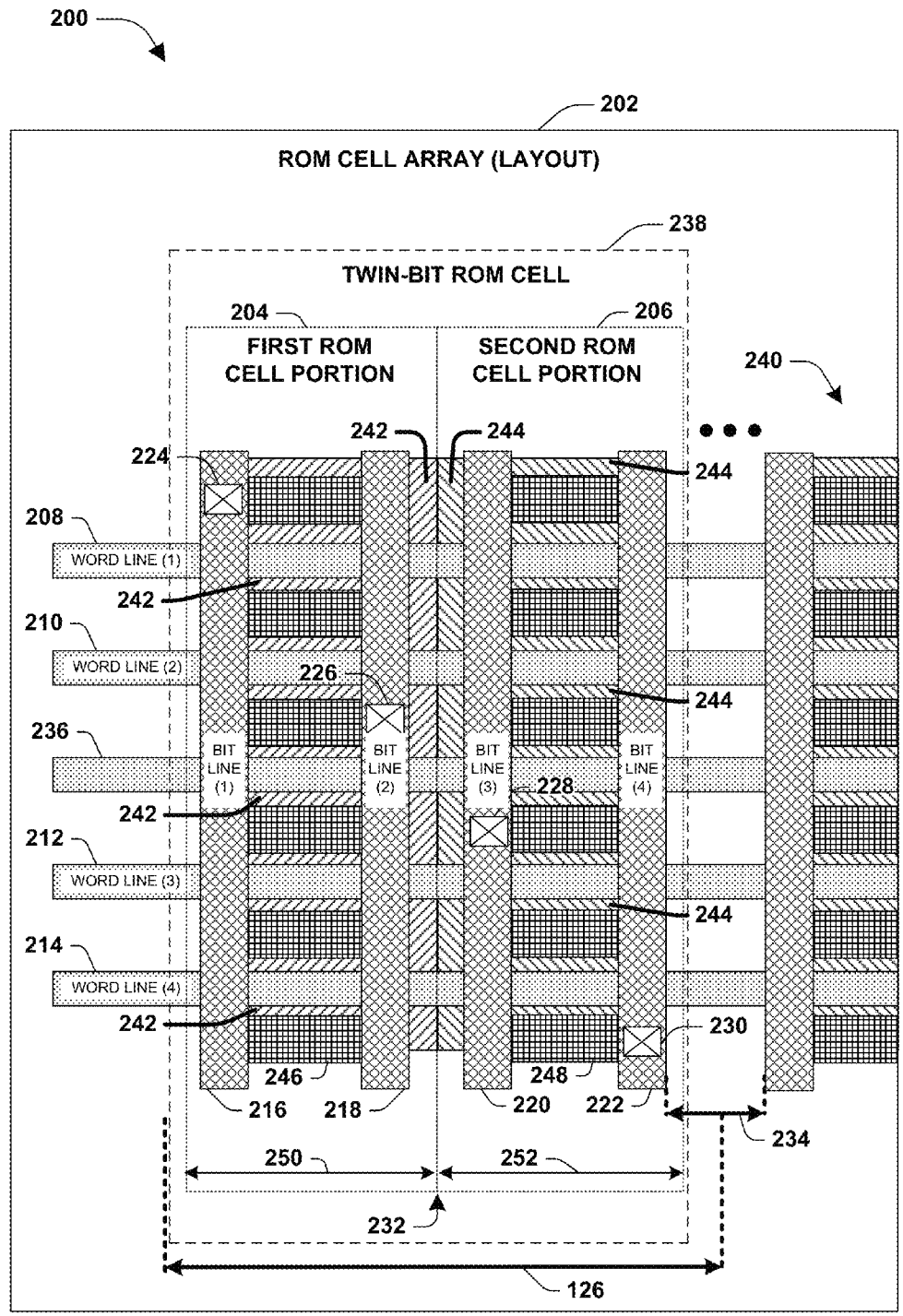
FIG. 2 is an illustration of an example of a design layout for a ROM cell array comprising a twin-bit ROM cell, in accordance with an embodiment.

FIG. 2 illustrates an example 200, in accordance with an embodiment, of a design layout for a ROM cell array 202 comprising a twin-bit ROM cell 238. The twin-bit ROM cell 238 comprises a first ROM cell portion 204 and a second ROM cell portion 206. A first bit line 216 and a second bit line 218 are associated with the first ROM cell portion 204, and a third bit line 220 and a fourth bit line 222 are associated with the second ROM cell portion 206. A first data bit value is associated with the first bit line 216 and the second bit line 218, and a second data bit value is associated with the third bit line 220 and the fourth bit line 222. The first data bit value or the second data bit value can be identified by a sensing amplifier based upon whether corresponding bit lines are at a pre-charge level, such as a voltage representing a logical "1", or are pulled down to ground, representing a logical "0", by transistors that associate bit lines with word lines.

The first ROM cell portion 204 is formed adjacent to the second ROM cell portion 206. For example, the first ROM cell portion 204 is contiguous with the second ROM cell portion 206. In this way, OD-to-OD spacing 232 between the first ROM cell portion 204 and the second ROM cell portion 206 is reduced, such that the OD-to-OD spacing 232 is negligible or substantially equal to zero. If the first ROM cell portion 204 has a width 250 of about 180 nm and the second ROM cell portion 206 has a width 252 of about 180 nm, then the twin-bit ROM cell has a pitch 126 of about 520 nm, which is substantially similar to the combined pitch 126 of the first and second ROM cells of FIG. 1. However, OD-to-OD spacing 234 between the twin-bit ROM cell 238 and an adjacent twin-bit ROM cell 240 is about 160 nm, which is about twice as large as the OD-to-OD spacing 124 between the first and second ROM cells of FIG. 1. It is to be appreciated that merely a portion of twin-bit ROM cell 240 is illustrated in FIG. 2. Increasing the OD-to-OD spacing between ROM cells improves isolation, cell current, ROM speed, and VCCmin performance, for example. In an example of improving OD-to-OD spacing, because the first ROM cell portion 204 is formed adjacent to the second ROM cell portion 206 with little to no OD-to-OD spacing 232 there-between, the OD-to-OD spacing 234 between the twin-bit ROM cell 238 and the twin bit ROM cell 240 is increased because the OD-to-OD spacing 234 can utilize the additional space gained from forming the first ROM cell portion 204 and the second ROM cell portion 206 next to one another.

In an example of the twin-bit ROM cell 238, the first ROM cell portion 204 comprises a first continuous OD region 242 that runs through one or more transistors of the first ROM cell portion 204, and the second ROM cell portion 206 comprises a second continuous OD region 244 that runs through one or more transistors of the second ROM cell portion 206. The continuous OD regions define one or more active regions, such as source regions and drain regions, for the one or more transistors. A first gate 208, a second gate 210, a third gate 212, and a fourth gate 214 are used as gates for the one or more transistors. It is contemplated that a number of gates, other than four, can be formed for the first ROM cell portion 204 or the second ROM cell portion 206, and that the instant application including the scope of the claims is not intended to be limited by the examples provided herein. A dummy gate 236, connected to a voltage source VSS line or ground, of an isolation transistor is disposed between the second gate 210 and the third gate 212 for isolation between the second gate 210 and the third gate 212, or respective transistors comprised thereof, while allowing the first continuous OD region 242 and the second continuous OD region 244 to be formed from continuous OD material, for example. The gates generally comprise a poly, metal, or other conductive gate material. The first gate 208 corresponds to a first word line, the second gate 210 corresponds to a second word line, the third gate 212 corresponds to a third word line, and the fourth gate 214 corresponds to a fourth word line of the ROM cell array 202. Turning on a word line activates a transistor that associates the word line with a bit line, such that the bit line, connected to a drain of the transistor, is pulled from a pre-charge state to ground through a source of the transistor.

The first ROM cell portion 204 is associated with the first bit line 216 and the second bit line 218, and the second ROM cell portion 206 is associated with the third bit line 220 and the fourth bit line 222. In an example, the bit lines are disposed in a metal (1) layer, and are connected to one or more metal (2) layers, such as metal (2) layer 246 and metal (2) layer 248, generally through conductive vias, such as vias 224 and 230, for example. The one or more metal (2) layers are connected to either a source region or a drain region of the continuous OD regions. By way of example, the first bit line 216 is connected to a source region or a drain region of the first continuous OD region 242 by virtue of via 224 which connects the first bit line 216 to the metal (2) layer, where the metal (2) layer is connected to the first continuous OD region 242.

Figure 4:
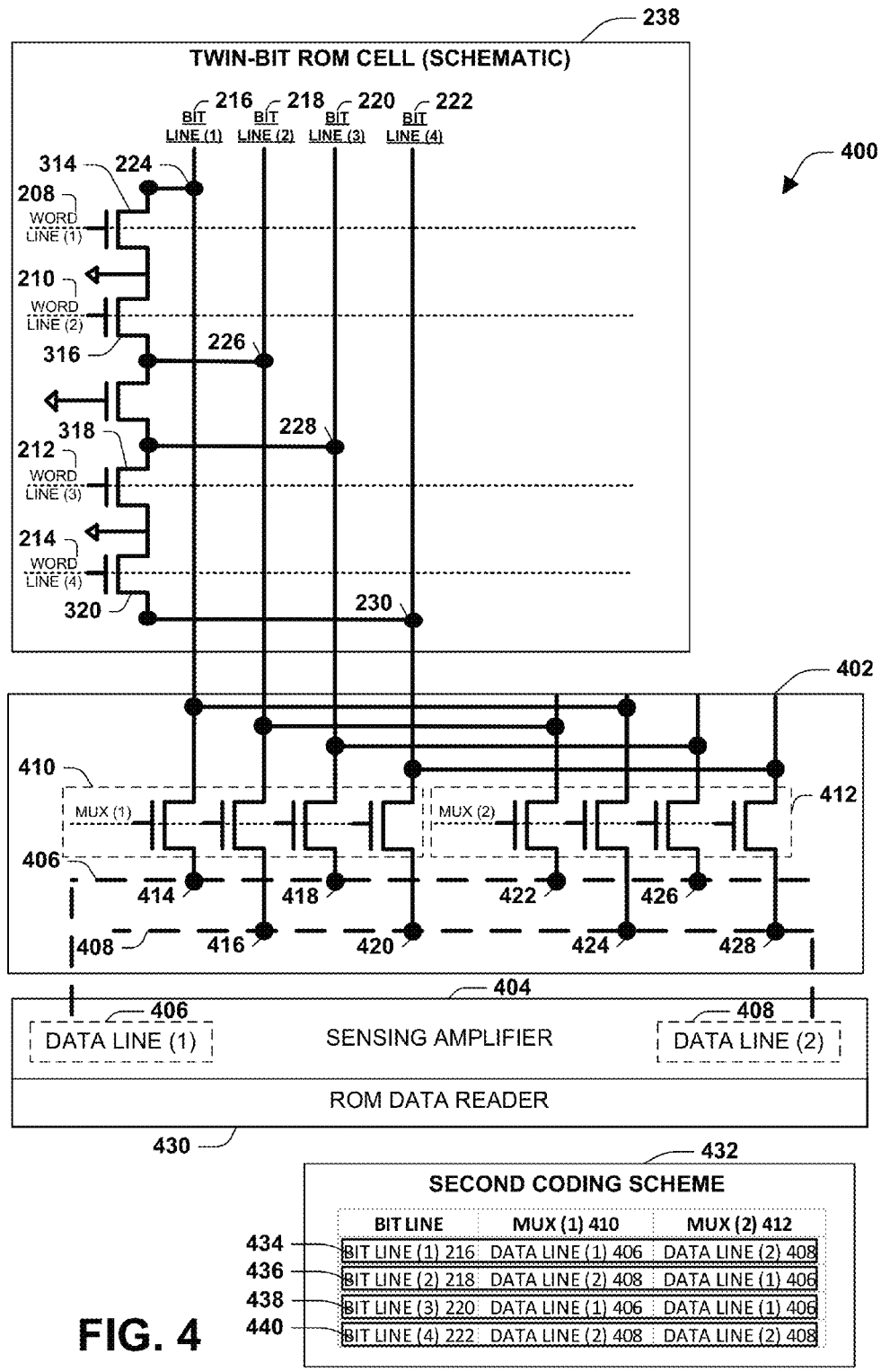
FIG. 4 is an illustration of an example of a circuit diagram schematic of a twin-bit ROM cell addressed according to a second coding scheme, in accordance with an embodiment.
Figure 5:
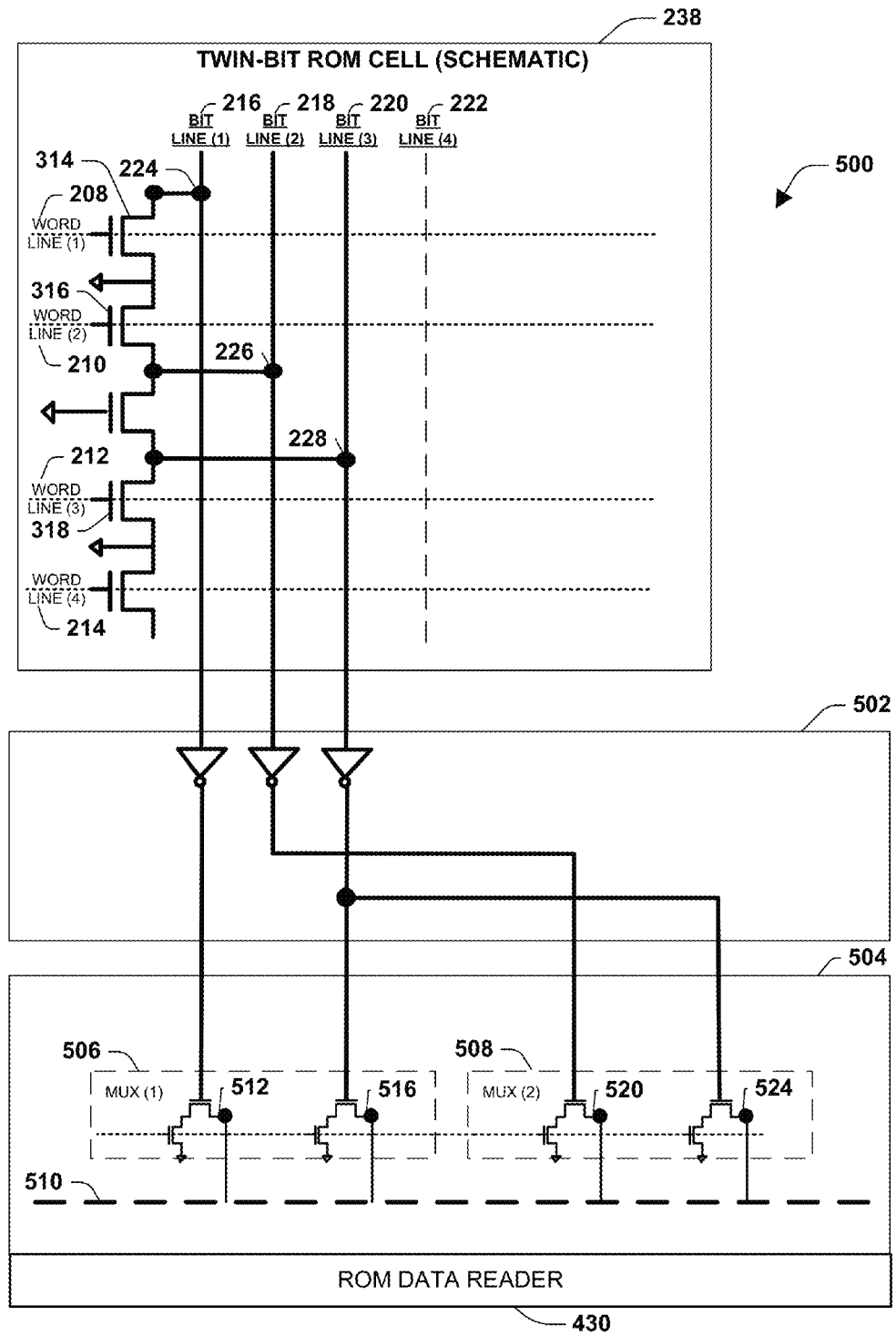
FIG. 5 is an illustration of an example of a circuit diagram schematic of a twin-bit ROM cell addressed according to a second coding scheme, in accordance with an embodiment.

In an example of applying the first coding scheme to the ROM cell array 202, a first ROM code is assigned to the first bit line 216, a second ROM code is assigned to the second bit line 218, a third ROM code is assigned to the third bit line 220, and a fourth ROM code is assigned to the fourth bit line 222. The first ROM cell portion 204 can represent a first data bit value and the second ROM cell portion 206 can represent a second data bit value according to four types of ROM codes, such as 01, 10, 00, and 11. Such ROM codes are also assigned to word lines. Based upon the assignment of ROM codes to word lines, respective word lines, through transistors, are associated with bit lines that are mapped to corresponding ROM codes by the first coding scheme. In this way, word lines are associated with bit lines so that a ROM code is selected, such as during a read operation, by a corresponding word line and bit line pairing, which can be read over one or more data lines, as illustrated in FIGS. 4 and 5, for example. In an embodiment of associating a word line to a bit line, if the first word line 208 is turned on to activate transistor 314, then the first bit line 216, which is connected to a drain of transistor 314 by conductive via 224, is pulled to ground through a source of transistor 314.

Figure 3:
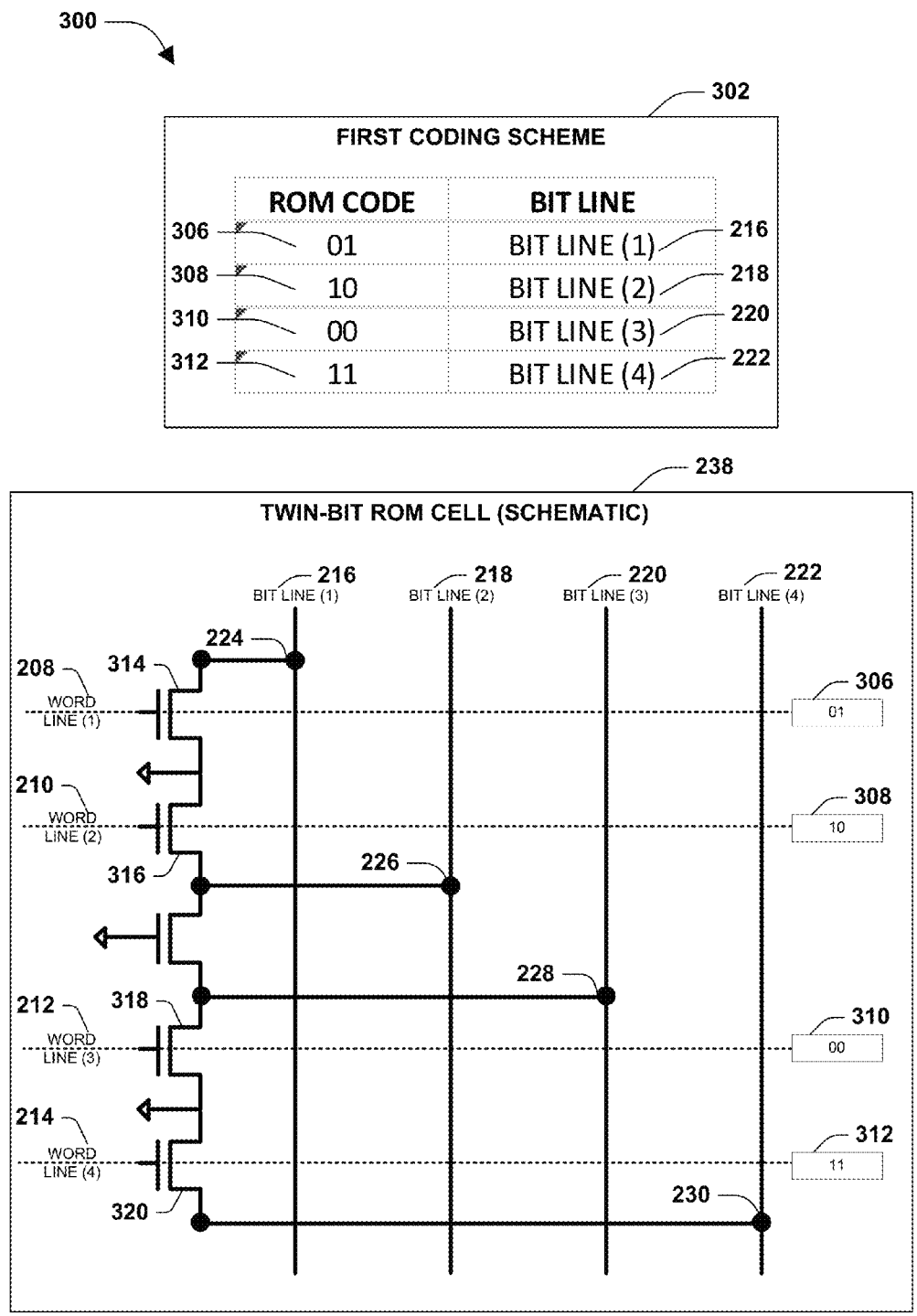
FIG. 3 is an illustration of an example of a circuit diagram schematic of a twin-bit ROM cell addressed according to a first coding scheme, in accordance with an embodiment.

In an embodiment of associating word lines with bit lines based upon the first coding scheme, if a first ROM code 306, such as 01, as depicted in FIG. 3, is assigned to the first word line 208, then the first bit line 216 is associated with the first word line 208 by electrically connecting the first bit line 216 to transistor 314 through conductive via 224 because the first ROM code 306 is mapped to the first bit line 216 by the first coding scheme 302, as illustrated in example 300 of FIG. 3. If a second ROM code 308, such as 10, is assigned to the second word line 210, then the second bit line 218 is associated with the second word line 210 by electrically connecting the second bit line 218 to the transistor 316 through conductive via 226 because the second ROM code 310 is mapped to the second bit line 218 by the first coding scheme 302, as illustrated in example 300 of FIG. 3. If a third ROM code 310, such as 00, is assigned to the third word line 212, then the third bit line 220 is associated with the third word line 212 by electrically connecting the third bit line 220 to the transistor 318 through conductive via 228 because the third ROM code 310 is mapped to the third bit line 220 by the first coding scheme 302, as illustrated in example 300 of FIG. 3. If a fourth ROM code 312, such as 11, is assigned to the fourth word line 214, the fourth bit line 222 is associated with the fourth word line 214 by electrically connecting the fourth bit line 222 to the transistor 320 through conductive via 230 because the fourth ROM code 312 is mapped to the fourth bit line 222 by the first coding scheme 302, as illustrated in example 300 of FIG. 3.

Because a word line is coupled to a gate of a transistor, activating or deactivating the word line turns the transistor on or off. Because a bit line is connected to a drain of the transistor and ground is connected to a source of the transistor, turning on the transistor will pull the bit line from a pre-charged state to ground. In this way, one or more bit lines are associated with one or more word lines, such that a sense amplifier can, in an embodiment, identify a first data bit value of the first ROM cell portion 204 by detecting a difference between a first state, such as a high state or a low state, of the first bit line 216 and a second state of the second bit line 218. The sense amplifier can, in an embodiment, identify a second data bit value of the second ROM cell portion 206 by detecting a difference between a third state of the third bit line 220 and a fourth state of the fourth bit line 222.

In an example, the ROM cell array 202 comprises an n-bit ROM cell. That is, the n-bit ROM cell is not limited to merely a twin-but ROM cell, but comprises an integer number n, such as two or more, ROM cell portions. In an example of a three-bit ROM cell, the three-bit ROM cell comprises a first ROM cell portion adjacent or contiguous to a second ROM cell portion, and a third ROM cell portion adjacent or contiguous to the second ROM cell portion. The first ROM cell portion is associated with a first data bit value, and the second ROM cell portion is associated with a second data bit value distinct from the first data bit value. The third ROM cell portion is associated with a third data bit value distinct from the first data bit value and distinct from the second data bit value. In this way, the ROM cell array 202 comprises one or more n-bit ROM cells that provide an increased OD-to-OD spacing between respective n-bit ROM cells as compared to OD-to-OD spacing between single-bit ROM cells within a ROM cell array 102.

FIG. 3 illustrates an example 300, in accordance with an embodiment, of a circuit diagram schematic of a twin-bit ROM cell 238 addressed according to a first coding scheme 302. The first coding scheme 302 is used to associate word lines with bit lines of the twin-bit ROM cell 238. In an example of the first coding scheme 302, a first bit line 216 is assigned a first ROM code (01) 306, a second bit line 218 is assigned a second ROM code (10) 308, a third bit line 220 is assigned a third ROM code (00) 310, and a fourth bit line 222 is assigned a fourth ROM code (11) 312.

In an embodiment of associating word lines with bit lines based upon the first coding scheme, if a first ROM code 306, such as 01, is assigned to the first word line 208, then the first bit line 216 is associated with the first word line 208 by connecting the first bit line 216 to a drain of a transistor 314 using conductive via 224 because the first ROM code 306 is mapped to the first bit line 216 by the first coding scheme 302. If a second ROM code 308, such as 10, is assigned to the second word line 210, then the second bit line 218 is associated with the second word line 210 by connecting the second bit line 218 to a drain of a transistor 316 using conductive via 226 because the second ROM code 310 is mapped to the second bit line 218 by the first coding scheme 302. If a third ROM code 310, such as 00, is assigned to the third word line 212, then the third bit line 220 is associated with the third word line 212 by connecting the third bit line 220 to a drain of a transistor 318 using conductive via 228 because the third ROM code 310 is mapped to the third bit line 220 by the first coding scheme 302. If a fourth ROM code 312, such as 11, is assigned to the fourth word line 214, then the fourth bit line 222 is associated with the fourth word line 214 by connecting the fourth bit line 222 to a drain of a transistor 230 using conductive via 230 because the fourth ROM code 312 is mapped to the fourth bit line 222 by the first coding scheme 302.

FIG. 4 illustrates an example 400, in accordance with an embodiment, of a circuit diagram schematic of a twin-bit ROM cell 238 addressed according to a second coding scheme 432. In an example, the twin-bit ROM cell 238 is also addressed according to a first coding scheme 302 to select corresponding word lines and bit lines for association, as illustrated in FIG. 3. For example, a first word line 208 is associated with a first bit line 216 through transistor 314, a second word line 210 is associated with a second bit line 218 through transistor 316, a third word line 212 is associated with a third bit line 220 through transistor 318, and a fourth word line 214 is associated with a fourth bit line 222 through transistor 320. The second coding scheme 432 is used to select bit lines that are to be sensed by a sensing amplifier that is configured to determine logical values associated with selected bit lines. In an embodiment, a logical value of a first data bit value is sensed by the sense amplifier based upon a selection of the first bit line 216 and the second bit line 218. In another example, a logical value of a second data bit value is sensed by the sense amplifier based upon a selection of the third bit line 220 and the fourth bit line 222. In an embodiment, a first multiplexer 410 or a second multiplexer 412 can be used to select respective bit lines.

The second coding scheme 432 is used to connect the one or more bit lines of the twin-bit ROM cell 238 to one or more data lines, such as data line (1) 406 and data line (2) 408. In an example of the second coding scheme 432, a first mapping 434 maps the first bit line 216 to the first data line 406 through a first multiplexer 410, and maps the first bit line 216 to the second data line 408 through a second multiplexer 412. Accordingly, the first bit line 216 is connected through the first multiplexer 410 to the first data line 406 by a first connection 414 and is connected through the second multiplexer 412 to the second data line 408 by a second connection 424.

A second mapping 436 maps the second bit line 218 to the second data line 408 through the first multiplexer 410, and maps the second bit line 218 to the first data line 406 through the second multiplexer 412. Accordingly, the second bit line 218 is connected through the first multiplexer 410 to the second data line 408 by a third connection 416 and is connected through the second multiplexer 412 to the first data line 406 by a fourth connection 422.

A third mapping 438 maps the third bit line 220 to the first data line 406 through the first multiplexer 410, and maps the third bit line 220 to the first data line 406 through the second multiplexer 412. Accordingly, the third bit line 220 is connected through the first multiplexer 410 to the first data line 406 by a fifth connection 418 and is connected through the second multiplexer 412 to the first data line 406 by a sixth connection 426.

A fourth mapping 440 maps the fourth bit line 222 to the second data line 408 through the first multiplexer 410, and maps the fourth bit line 222 to the second data line 408 through the second multiplexer 412. Accordingly, the fourth bit line 222 is connected through the first multiplexer 410 to the second data line 408 by a seventh connection 420 and is connected through the second multiplexer 412 to the second data line 408 by an eighth connection 428. In this way, a second coding structure 402 connects one or more bit lines of the twin-bit ROM cell 238, through one or more multiplexers, to one or more data lines of a data reader 430 comprising a sensing amplifier 404, such as a single-end sensing amplifier or a differential sensing amplifier.

In one example of identifying logical values of data bit values from the twin-bit ROM cell 238, the sensing amplifier 404 is connected to the first data line 406 and the second data line 408. The first bit line 216, the second bit line 218, the third bit line 220, and the fourth bit line 222 are pre-charged to a logical "1". If a bit line is pulled down to "0" by activation of a word line that turns on a transistor connected to the bit line, then the voltage level being pulled towards "0" is passed from the bit line through a multiplexer to a data line connected to the sensing amplifier 404. Otherwise, the bit line remains at the pre-charged level, and the voltage level of a logical "1" is passed from the bit line through a multiplexer to a data line connected to the sensing amplifier 404. In this way, the voltage level pulled towards "0" or the voltage level of "1" is passed through a selected multiplexer, such as the first multiplexer 410 or the second multiplexer 412, to either the first data line 406 or the second data line 408. For example, if the first word line 208 is activated and the second word line 210 is not activated, then the first bit line 216 is pulled down towards a "0" by transistor 314 and the second bit line 218 remains at the pre-charged level of "1". If the first multiplexer 410 is selected, then the voltage level pulled towards "0" is passed from the first bit line 216 to the first data line 406 through first connection 414, and the voltage level of "1" is passed from the second bit line 218 to the second data line 408 through second connection 416. In this way, the sensing amplifier 404, based on the voltage difference between the first bit line 216 and the second bit line 218, can identify a logical value for a first data bit value associated with the first bit line 216 and the second bit line 218, which correspond to a first portion of the twin-bit ROM cell 238, for example, by detecting a difference between the voltage levels of the first data line 406 and of the second data line 408.

A single sense amplifier or a differential sensing amplifier, connected to at least one of the first data line 406 or the second data line 408, can be used to identify logical values of the first data bit value or the second data bit value from the twin-bit ROM cell 238 because two data lines are utilized to represent a data bit value and either the first multiplexer 410 or the second multiplexer 412 can be selected during a read operation. The sensing amplifier 404 can either detect a difference in voltage or a difference in current between one or more data lines during a read operation of the twin-bit ROM cell 238. For example, a differential sensing amplifier is connected to both the first data line 406 and the second data line 408, such that the differential sensing amplifier detects a difference of potential of between the first data line 406 and the second data line 408 during a read operation. In contrast, the single-end sensing amplifier is connected to a single data line, such as the first data line 406 or the second data line 408, such that the single-end sensing amplifier detects whether a potential of a signal along a data line, through a selected multiplexer, is higher or lower than a predetermined potential, as illustrated in FIG. 5, for example.

FIG. 5 illustrates an example 500, in accordance with an embodiment, of a circuit diagram schematic of a twin-bit ROM cell 238 addressed according to a first coding scheme and a second coding scheme. For example, a first word line 208 is associated with a first bit line 216 through transistor 314, a second word line 210 is associated with a second bit line 218 through transistor 316, a third word line 212 is associated with a third bit line 220 through transistor 318. In some embodiments, the twin-bit ROM cell 238 does not comprise a fourth bit line 222, as illustrated, and thus a fourth word line 214 is not associated with the fourth bit line 222.

The second coding scheme is used to connect the one or more bit lines of the twin-bit ROM cell 238 to a data line 510. In an example, a sensing amplifier 502, such as a single-end sensing amplifier, is coupled to the first bit line 216, the second bit line 218, and the third bit line 220. The sensing amplifier 502 is coupled to a secondary coding structure 504 of a ROM data reader 430, and connects the respective bits lines to a first multiplexer 506 or a second multiplexer 508 of the secondary coding structure 504. The secondary coding structure 504 comprises a first connection 512 between the first bit line 216 and the data line 510 through the first multiplexer 506. In an embodiment, the secondary coding structure 504 does not comprise a second connection between the first bit line 216 and the data line 510 through the second multiplexer 508. In an embodiment, the secondary coding structure 504 does not comprise a third connection between the second bit line 218 and the data line 510 through the first multiplexer 506. The secondary coding structure 504 comprises a fourth connection 520 between the second bit line 218 and the data line 510 through the second multiplexer 508. The secondary coding structure 504 comprises a fifth connection 516 between the third bit line 220 and the data line 510 through the first multiplexer 506, and a sixth connection 524 between the third bit line 220 and the data line 510 through the second multiplexer 508. In an embodiment, the secondary coding structure 504 does not comprise a seventh connection between the fourth bit line 222 and the data line 510 through the first multiplexer 506, and an eighth connection between the fourth bit line 222 and the data line 510 through the second multiplexer 508.

The ROM data reader 430 is configured to read a state of the twin-bit ROM cell 238 based upon sensing a potential of "0" or "1" along the data line 510. The state of the twin-bit ROM cell 238 is dependent upon which multiplexer is selected within the secondary coding structure 504 during a read operation. The secondary coding structure is configured to provide an indication of at least one of the first data bit value for the first ROM cell portion or the second data bit value for the second ROM cell portion.

Figure 6:
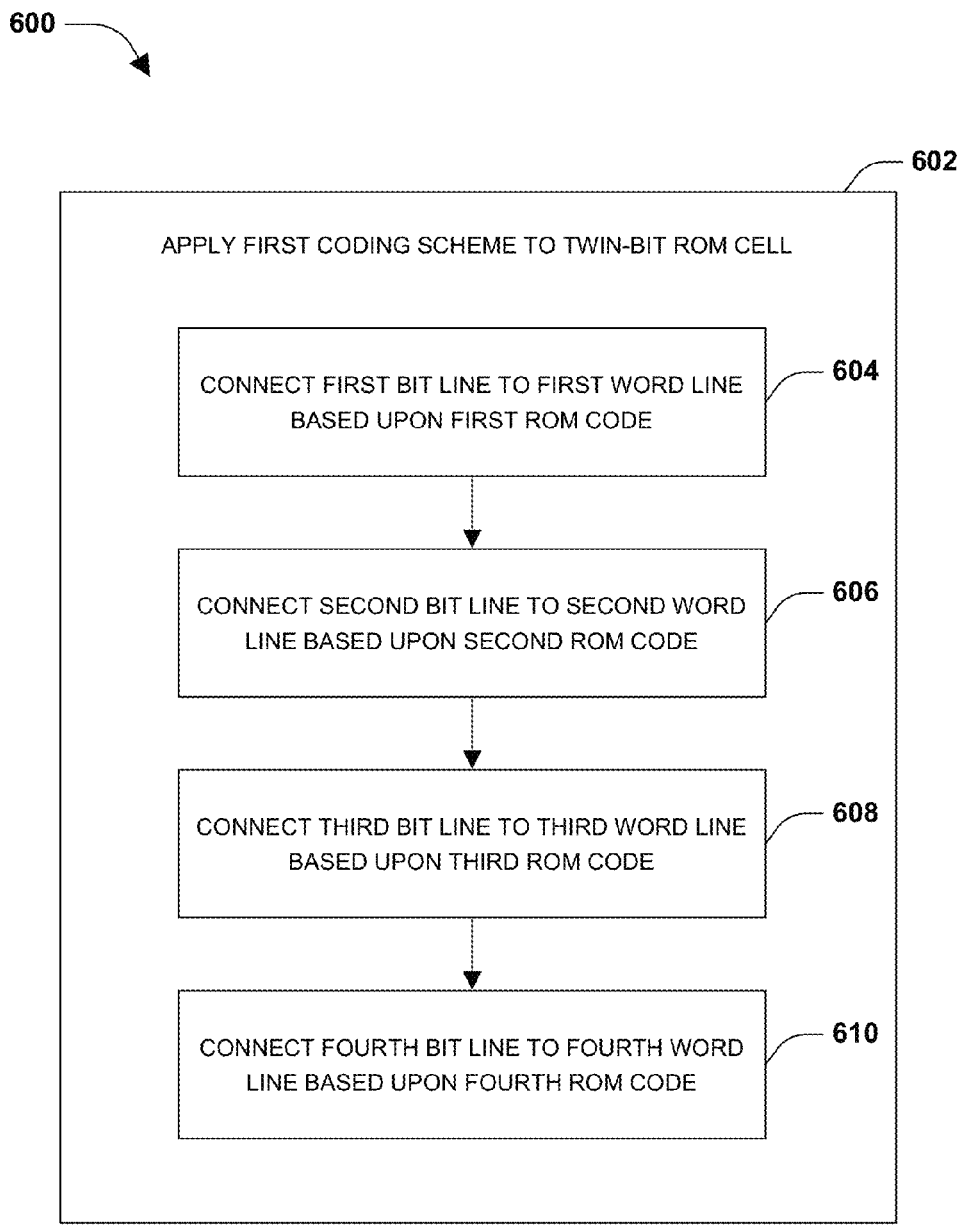
FIG. 6 is a flow diagram illustrating an example method of addressing a first ROM cell portion and a second ROM cell portion of a twin-bit ROM cell, in accordance with an embodiment.

An embodiment of addressing a first ROM cell portion 204 and a second ROM cell portion 206 of a twin-bit ROM cell 238 is illustrated by an exemplary method 600 in FIG. 6. The first ROM cell portion 204 and the second ROM cell portion 206 are, for example, addressed during reading of the twin-bit ROM cell 238, such that data stored by the first ROM cell portion 204 can be distinguished from data stored by the second ROM cell portion 206. At 602, a first coding scheme 302 is applied to the twin-bit ROM cell 238. For example, a first bit line 216 is associated with a first word line 208 based upon a first ROM code 306, at 604. At 606, a second bit line 218 is associated with a second word line 210 based upon a second ROM code 308. At 608, a third bit line 220 is associated with a third word line 212 based upon a third ROM code 310. At 610, a fourth bit line 222 is associated with a fourth word line 214 based upon a fourth ROM code 312. In this way, the one or more word lines of a ROM cell array are connected to the one or more bit lines of the twin-bit ROM cell 238.

In an example, a second coding scheme 432 is applied to the twin-bit ROM cell 238 to connect one or more bit lines to one or more data lines. For example, the first bit line 216 is connected through a first multiplexer 410 to a first data line 406 by a first connection 414 and is connected through a second multiplexer 412 to a second data line 408 by a second connection 424. The second bit line 218 is connected through the first multiplexer 410 to the second data line 408 by a third connection 416 and is connected through the second multiplexer 412 to the first data line 406 by a fourth connection 422. The third bit line 220 is connected through the first multiplexer 410 to the first data line 406 by a fifth connection 418 and is connected through the second multiplexer 412 to the first data line 406 by a sixth connection 426. The fourth bit line 222 is connected through the first multiplexer 410 to the second data line 408 by a seventh connection 420 and is connected through the second multiplexer 412 to the second data line 408 by an eighth connection 428.

Because the first bit line 216 and the second bit line 218 are associated with a first data bit value of the first ROM cell portion 204, a sensing amplifier can identify a logical value for the first data bit value based upon sensing a first state of the first bit line 216 and a second state of the second bit line 218 over at least one of the first data line 406 or the second data line 408. Because the third bit line 220 and the fourth bit line 222 are associated with a second data bit value of the second ROM cell portion 206, the sensing amplifier can identify a logical value for the second data bit value based upon sensing a third state of the third bit line 220 and a fourth state of the fourth bit line 222 over at least one of the first data line 406 or the second data line 408.

According to an aspect of the instant disclosure, a ROM cell array is provided. The ROM cell array comprises a ROM cell comprising a first ROM cell portion adjacent to a second ROM cell portion. The first ROM cell portion is associated with a first data bit value. The second ROM cell portion is associated with a second data bit value that is distinct from the first data bit value. The ROM cell is configured according to a first coding scheme that maps one or more ROM codes to one or more bit lines.

According to an aspect of the instant disclosure, a method for addressing a first ROM cell portion and a second ROM cell portion of a twin-bit ROM cell is provided. The method comprises applying a first coding scheme to the twin-bit ROM cell. For example, responsive to a first ROM code being assigned to a first word line, the first word line is associated with a first bit line based upon the first coding scheme mapping the first ROM code to the first bit line. Responsive to a second ROM code being assigned to a second word line, the second word line is associated with a second bit line based upon the first coding scheme mapping the second ROM code to the second bit line. Responsive to a third ROM code being assigned to a third word line, the third word line is associated with a third bit line based upon the first coding scheme mapping the third ROM code to the third bit line. Responsive to a fourth ROM code being assigned to a fourth word line, the fourth word line is associated with a fourth bit line based upon the first coding scheme mapping the fourth ROM code to the fourth bit line.

According to an aspect of the instant disclosure, a ROM cell array is provided. The ROM cell array comprises a ROM cell comprising a first ROM cell portion adjacent to a second ROM cell portion. The first ROM cell portion is associated with a first data bit value. The second ROM cell portion is associated with a second data bit value that is distinct from the first data bit value. The ROM cell is configured according to a first coding scheme that maps one or more bit lines to one or more word lines based upon one or more ROM codes. The first data bit value corresponds to a first bit line and a second bit line of the ROM cell. The second data bit value corresponds to a third bit line and a fourth bit line of the ROM cell.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. For example, the arrangements/orders of the acts illustrated in FIG. 6 are merely examples, and some acts may be performed concurrently, some acts may be independent of other acts and/or some acts may be optional such that a method may be performed without one or more acts.

As used in herein "or" is intended to mean an inclusive "or" rather than an exclusive "or". In addition, "a" and "an" as used herein may generally be construed to mean "one or more" unless specified otherwise or clear from context to be directed to a singular form. Also, at least one of A and B and/or the like generally means A or B or both A and B.

Also, although the application has been shown and described with respect to one or more implementations, equivalent alterations and modifications will occur to others of ordinary skill in the art based upon a reading and understanding of this specification and the annexed drawings. The application includes all such modifications and alterations. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function. In addition, while a particular feature of the application may have been disclosed with respect to only one of several implementations, such feature may be combined with one or more other features of the other implementations as may be desired and/or advantageous for any given or particular application. Furthermore, to the extent that "includes", "having", "has", "with" and/or the like are used herein, such terms are intended to be inclusive in a manner similar to "comprising."

What is claimed is:

1. A ROM cell array, comprising:
   a ROM cell comprising a first ROM cell portion and a second ROM cell portion, the first ROM cell portion associated with a first data bit value and the second ROM cell portion associated with a second data bit value distinct from the first data bit value, the first ROM cell portion comprising a shared active region situated between a first gate of the first ROM cell portion and a second gate of the first ROM cell portion, the shared active region connected to a voltage source, and the ROM cell configured according to a first coding scheme that maps one or more ROM codes to one or more bit lines.

2. The ROM cell array of claim 1, the ROM cell configured according to the first coding scheme such that:
   a first bit line of the one or more bit lines is associated with a first word line based upon the first word line being assigned a first ROM code of the one or more ROM codes that is mapped to the first bit line by the first coding scheme;
   a second bit line of the one or more bit lines is associated with a second word line based upon the second word line being assigned a second ROM code of the one or more ROM codes that is mapped to the second bit line by the first coding scheme;
   a third bit line of the one or more bit lines is associated with a third word line based upon the third word line being assigned a third ROM code of the one or more ROM codes that is mapped to the third bit line by the first coding scheme; and
   a fourth bit line of the one or more bit lines is associated with a fourth word line based upon the fourth word line being assigned a fourth ROM code of the one or more ROM codes that is mapped to the fourth bit line by the first coding scheme.

3. The ROM cell array of claim 1, the ROM cell configured according to a second coding scheme such that:
   a first bit line of the one or more bit lines is mapped to at least one of a first data line or a second data line;
   a second bit line of the one or more bit lines is mapped to at least one of the first data line or the second data line;
   a third bit line of the one or more bit lines is mapped to at least one of the first data line or the second data line; and
   a fourth bit line of the one or more bit lines is mapped to at least one of the first data line or the second data line.

4. The ROM cell array of claim 1, the ROM cell configured according to a second coding scheme such that:
   a first connection is created between a first bit line of the one or more bit lines and a first data line and a second connection is created between the first bit line and a second data line;
   a third connection is created between a second bit line of the one or more bit lines and the second data line and a fourth connection is created between the second bit line and the first data line;
   a fifth connection is created between a third bit line of the one or more bit lines and the first data line and a sixth connection is created between the third bit line and the first data line; and
   a seventh connection is created between a fourth bit line of the one or more bit lines and the second data line and an eighth connection is created between the fourth bit line and the second data line.

5. The ROM cell array of claim 4, comprising:
   a first multiplexer comprising the first connection between the first bit line and the first data line, the third connection between the second bit line and the second data line, the fifth connection between the third bit line and the first data line, and the seventh connection between the fourth bit line and the second data line.

6. The ROM cell array of claim 4, comprising:
   a second multiplexer comprising the second connection between the first bit line and the second data line, the fourth connection between the second bit line and the first data line, the sixth connection between the third bit line and the first data line, and the eighth connection between the fourth bit line and the second data line.

7. The ROM cell array of claim 3, comprising:
   a ROM data reader configured to:
      identify the first data bit value for the first ROM cell portion based upon:
         at least one output value of the first data line;
         at least one output value of the second data line; or
         the at least one output value of the first data line and the at least one output value of the second data line.

8. The ROM cell array of claim 3, comprising:
   a ROM data reader configured to:
      identify the second data bit value for the second ROM cell portion based upon:
         at least one output value of the first data line;
         at least one output value of the second data line; or
         the at least one output value of the first data line and the at least one output value of the second data line.

9. The ROM cell array of claim 1, comprising
   a ROM data reader comprising at least one of a differential sensing amplifier or
   a single-end sensing amplifier.

10. The ROM cell array of claim 2, comprising:
    a single-end sensing amplifier coupled to at least one of the first bit line, the second bit line, the third bit line, or the fourth bit line ; and
    a secondary coding structure coupled to the single-end sensing amplifier, the secondary coding structure configured to at least one of:
       provide an indication of the first data bit value for the first ROM cell portion; or
       provide an indication of the second data bit value for the second ROM cell portion.

11. The ROM cell array of claim 10, the secondary coding structure comprising:
    a first multiplexer coupled to a data line; and
    a second multiplexer coupled to the data line.

12. The ROM cell array of claim 1, the ROM cell configured according to a second coding scheme such that:
    a first connection is created between a first bit line of the one or more bit lines and a data line through a first multiplexer;
    a second connection is created between a second bit line of the one or more bit lines and the data line through a second multiplexer;
    a third connection is created between a third bit line of the one or more bit lines and the data line through the first multiplexer; and
    a fourth connection is created between the third bit line and the data line through the second multiplexer.

13. A method for addressing a first ROM cell portion and a second ROM cell portion of a twin-bit ROM cell, comprising:
    applying a first coding scheme to a twin-bit ROM cell, comprising:
       responsive to a first ROM code being assigned to a first word line, associating the first word line with a first bit line of a first ROM cell portion of the twin-bit ROM cell based upon the first coding scheme mapping the first ROM code to the first bit line;

responsive to a second ROM code being assigned to a second word line, associating the second word line with a second bit line of the first ROM cell portion based upon the first coding scheme mapping the second ROM code to the second bit line;

responsive to a third ROM code being assigned to a third word line, associating the third word line with a third bit line of a second ROM cell portion of the twin-bit ROM cell based upon the first coding scheme mapping the third ROM code to the third bit line; and responsive to a fourth ROM code being assigned to a fourth word line, associating the fourth word line with a fourth bit line of the second ROM cell portion based upon the first coding scheme mapping the fourth ROM code to the fourth bit line.

14. The method of claim 13, comprising:
applying a second coding scheme to the twin-bit ROM cell, comprising:
  mapping the first bit line to at least one of a first data line or a second data line;
  mapping the second bit line to at least one of the first data line or the second data line;
  mapping the third bit line to at least one of the first data line or the second data line; and
  mapping the fourth bit line to at least one of the first data line or the second data line.

15. The method of claim 14, the applying a second coding scheme comprising:
  creating a first connection between the first bit line and the first data line and a second connection between the first bit line and the second data line;
  creating a third connection between the second bit line and the second data line and a fourth connection between the second bit line and the first data line;
  creating a fifth connection between the third bit line and the first data line and a sixth connection between the third bit line and the first data line; and
  creating a seventh connection between the fourth bit line and the second data line and an eighth connection between the fourth bit line and the second data line.

16. The method of claim 14, comprising:
identifying a first data bit value for the first ROM cell portion based upon:
  at least one output value of the first data line;
  at least one output value of the second data line; or
  the at least one output value of the first data line and the at least one output value of the second data line.

17. A ROM cell array, comprising:
a ROM cell comprising a first ROM cell portion and a second ROM cell portion, the first ROM cell portion associated with a first data bit value and the second ROM cell portion associated with a second data bit value distinct from the first data bit value, the first ROM cell portion comprising a shared active region situated between a first gate of the first ROM cell portion and a second gate of the first ROM cell portion, the shared active region connected to a voltage source, and the ROM cell configured according to a first coding scheme that maps a first ROM code to a first bit line to which a first active region of the first ROM cell portion is connected.

18. The ROM cell array of claim 17, the voltage source comprising ground.

19. The ROM cell array of claim 17, the first ROM cell portion comprising a second active region to which a second bit line is connected.

20. The ROM cell array of claim 19, the shared active region situated between the first active region and the second active region.

* * * * *